United States Patent [19]

Gardner

[11] Patent Number: 5,511,098

[45] Date of Patent: Apr. 23, 1996

[54] DIGITAL METHODS AND APPARATUS REVERSE LINK SIGNAL DETECTION AND RECOVERY IN A MOBILE DATA BASE STATION

[75] Inventor: Steven H. Gardner, San Diego, Calif.

[73] Assignee: Pacific Communication Sciences, Inc., San Diego, Calif.

[21] Appl. No.: 152,198

[22] Filed: Nov. 12, 1993

[51] Int. Cl.[6] .................................................... H04B 1/26
[52] U.S. Cl. ............................................ 375/340; 375/365
[58] Field of Search ................................. 375/39, 94, 95, 375/97, 114; 329/304

[56] References Cited

U.S. PATENT DOCUMENTS

| | | | |
|---|---|---|---|
| 4,608,703 | 8/1986 | Kaga et al. | 375/39 |
| 4,849,991 | 7/1989 | Arnold | 375/106 |
| 5,113,415 | 5/1992 | Muto | 375/83 |
| 5,121,414 | 6/1992 | Levine et al. | 375/114 |
| 5,291,527 | 3/1994 | Haruyama | 375/94 |
| 5,343,499 | 8/1994 | Jasper et al. | 375/39 |
| 5,363,414 | 11/1994 | Muto | 375/94 |

FOREIGN PATENT DOCUMENTS 2252889  8/1992  United Kingdom.

Primary Examiner—Stephen Chin
Assistant Examiner—Timothy J. May
Attorney, Agent, or Firm—Blakely, Sokoloff, Taylor & Zafman

[57] ABSTRACT

Digital methods and apparatus for reverse link signal detection and recovery in a mobile data base station. In accordance with the method, the received signal is frequency downshifted by multiplying the received signal by inphase and quadrature components of a local carrier oscillator, and the resulting downshifted inphase and quadrature components of the signal vector is sampled and digitized at a rate of more than twice the expected bit rate. Difference vectors for digitized downshifted signal vectors one expected bit time apart are determined and examined for detection of a dotting sequence and for estimation of the carrier frequency error, which on detection of the dotting sequence, is used to initially correct the digitized downshifted signal vectors for the frequency error. Techniques for bit timing recovery, frequency error correction during data detection and detection of voice versus data, as well as other features of the invention, are disclosed.

5 Claims, 4 Drawing Sheets

DIGITAL METHODS AND APPARATUS REVERSE LINK SIGNAL DETECTION AND RECOVERY IN A MOBILE DATA BASE STATION

BACKGROUND OF THE INVENTION

1. Field of the Invention

The present invention relates to the field of mobile digital communications, and more particularly, cellular communications.

2. Prior Art

The Cellular Digital Packet Data (CDPD) network described in Cellular Digital Packet Data System Specification V1.0, Jul. 19, 1993, is designed to operate as an extension of existing data communications networks. From the mobile subscriber's perspective, the CDPD Network is simply a wireless mobile extension of traditional networks.

CDPD shares the transmission facilities of existing Advanced Mobile Phone System (AMPS) cellular telephone networks. CDPD Mobile Data Base Station (MDBS) equipment is located at a cellular carrier's cell site and can be integrated with existing AMPS base station cellular equipment. CDPD provides a non-intrusive, packet switched data service that shares frequency channels with AMPS without impacting AMPS service.

CDPD provides packetized data communications via Mobile End Systems (M-ESs, the term used by the CDPD standard to describe the communication terminals used by subscribers to the CDPD service) which are analogous to mobile telephones. The packetized nature of the data transmissions from the M-ESs allows many CDPD users to share a common channel, accessing the channel only when they have data to send, and otherwise leaving it available to other CDPD users. For users whose data transmission requirements are characterized by numerous transmissions of short to medium duration, CDPD is a far more cost effective solution than using circuit switched cellular data modems. CDPD is also superior to other existing packet data systems because it has been adapted as a national standard by the cellular industry and will be available nationwide wherever cellular voice capability exists.

By comparison to AMPS, the infrastructure requirements of CDPD are very small. The multiple access nature of the system makes it possible to provide substantial CDPD coverage to many users simultaneously with the installation of only one CDPD MDBS radio on a given sector. Unlike AMPS, which uses in-band FSK signaling to establish call connections and an out-of-band (control channel) signal to control the mobility, CDPD uses a sophisticated set of in-band protocols to control channel access and mobility and to manage the transfer of data from end to end through the CDPD network.

Although the CDPD system shares existing AMPS radio frequency channels, AMPS calls are given first priority, and they are always able to preempt the use of any channel being used by CDPD. (The cellular service provider may, however, opt to dedicate a channel or channels to CDPD usage. In this case AMPS calls will never attempt to preempt the channel(s) occupied by CDPD.) The most common configuration of the MDBS uses a technique commonly referred to as "RF sniffing" to detect the presence or absence of AMPS activity on a given channel (in some more highly integrated systems the MDBS can be given channel information directly by the AMPS equipment via a data interface). If the sniffer finds that a channel is not in use, the MDBS may establish a CDPD network on this channel by transmitting on the forward link. M-ESs will acquire the forward link, register, and then begin to transmit packets on the return channel according to a Digital Sense Multiple Access (DSMA) scheme in which the M-ESs access the channel only when they have data to send.

In particular, when an IDLE flag is transmitted by the MDBS on the forward link, it propagates to the subscriber unit and is detected by the subscriber unit, which may choose to begin transmitting. If it does begin to transmit, it begins with the transmission of a dotting sequence, consisting of a 38 bit string of alternating ones and zeroes, modulated on an RF carrier. The dotting sequence is not differentially coded, so during the transmission of the dotting sequence, the phase changes by 90 degrees (nominally) when a one is sent and by −90 degrees when a zero is sent. Because of the intersymbol interference in the GMSK (Gaussian minimum shift keyed) modulation, the actual phase change is closer to 54 degrees. The purpose of the dotting sequence is to provide a reference signal for the MDBS to lock onto to establish the bit timing in the MDBS before the end of the dotting sequence, so that bit timing is established before transmission of further data signals.

Immediately after the transmission of the dotting sequence, the subscriber unit will transmit a 22 bit synchronization signal, then data, typically 385 bits, which will include both the desired data and error detection and correction bits for the data. In an analog system, the MDBS would start receiving the RF signal containing the dotting sequence, demodulate or downshift the same and try to detect the bits therein with arbitrary timing, pulling in to an adequately accurate bit timing after some number of bits of the dotting sequence have been received, depending at least in part on how far off the arbitrary timing was to start with, signal quality, etc. Thus while bit timing would normally be established before the end of the dotting sequence, how far before the end would vary, so that detection of at least the later part of the alternating 1,0 string gives no indication as to exactly when the string will end and the data will start. The purpose of the 22 bit synchronization signal, therefore, is to provide a string of correlation bits to the MDBS, detectable by the already established bit timing, to allow the MDBS to expressly orient itself to bit positions in the string so as to be able to identify the true beginning of data in the received signal. The 22 bit synchronization signal is chosen so that it will provide a high correlation with an identical reference bit string when the two are aligned, but a poor correlation with an identical reference bit string when the two are miss-aligned one or more bits.

In a digital system, the ability to store at least some prior signals and to analyze them after the fact should frequently allow recovery of the entire dotting sequence. However the integrity of the bit alignment achievable between transmitter and receiver with the correlation with the entire 22 bit synchronization signal is still far superior to trying to align to the ends of the dotting sequence. Also the Cellular Digital Packet Data System Specification hereinbefore referred to requires an ability to detect the presence of an arbitrary or random data stream in a received signal. Thus a pure correlation to the dotting sequence, without more, would not be adequate for satisfying this specification requirement.

The purpose of the present invention is to provide methods and apparatus for the down conversion of the RF signal using a coarse/fine frequency correction, for the detection of the dotting sequence and for establishment and maintenance of receiver timing, some of the foregoing techniques also being useful in the subscriber units for forward link data communication. The present invention also allows the detection of the presence of an arbitrary or random data stream in a received signal as required by the Cellular Digital Packet Data System Specification herein before referred to.

BRIEF SUMMARY OF THE INVENTION

Digital methods and apparatus for reverse link signal detection and recovery in a mobile data base station are disclosed. In accordance with the method, the received signal is frequency downshifted by multiplying the received signal by inphase and quadrature components of a local carrier oscillator, and the resulting downshifted inphase and quadrature components of the signal vector is sampled and digitized at a rate of more than twice the expected bit rate. Difference vectors for digitized downshifted signal vectors one expected bit time apart are determined and examined for detection of a dotting sequence and for estimation of the carrier frequency error, which on detection of the dotting sequence, is used to initially correct the digitized downshifted signal vectors for the frequency error. Bit timing is recovered by using samples taken near the zero value of the quadrature component of the signal vector, with frequency error correction during data detection being accomplished by a variation of the frequency error correction during the dotting sequence. Other features of the invention including detection of voice versus data are disclosed.

DETAILED DESCRIPTION OF THE INVENTION

Figure 1:
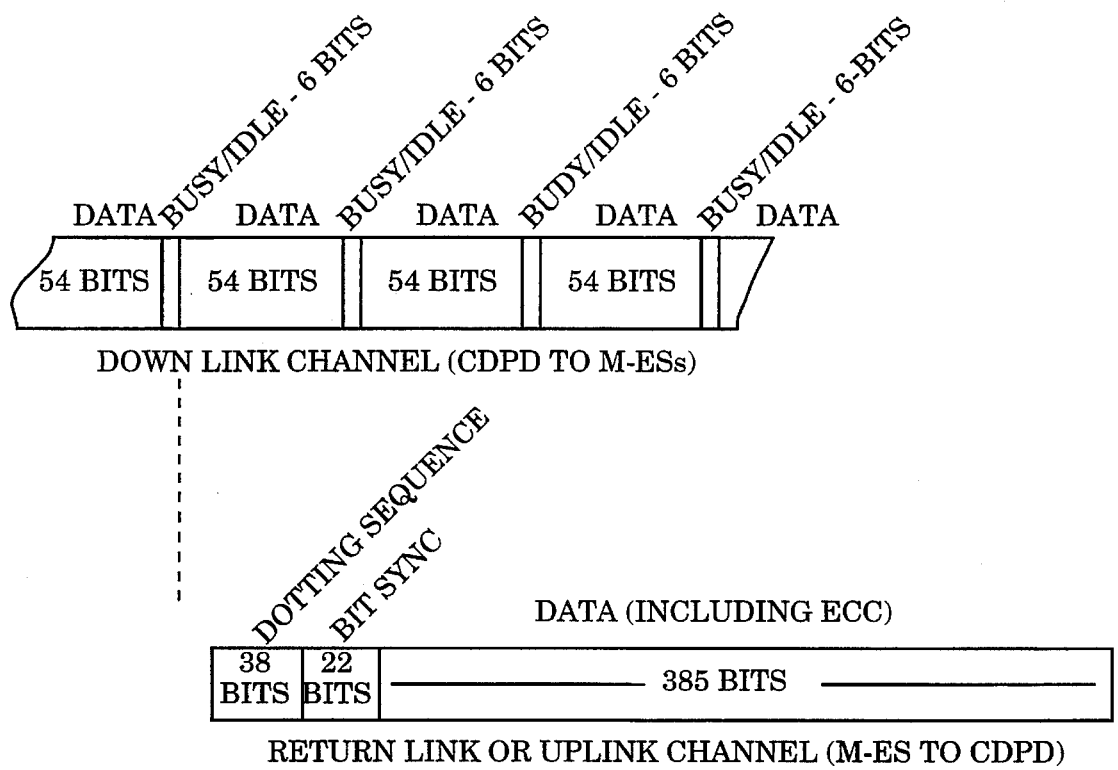
FIG. 1 is a diagram illustrating the forward link signal format and the typical reverse link signal format for a M-ES responding to an reverse link idle condition as indicated by the busy/idle flag in the forward link signal.

In accordance with the CDPD specification, the MDBS will transmit on the forward link a carrier modulated by a substantially continuous bit stream comprising successive 60 bit increments, each of which consists of 54 bits of data and a 6 bit flag indicating whether the associated return link channel to the MDBS is busy or idle. This is illustrated in FIG. 1. The M-ESs which are active (on) will monitor the forward link, and when the forward link indicates that the return channel is idle, the M-ESs having a message to transmit may begin transmitting immediately after the busy/idle flag is complete. In that regard, the CDPD specification provides a procedure, the details of which are not relevant to the present invention, to make it unlikely that more than one M-ES will respond to an idle flag at any one time. If by chance more than one M-ES does respond, the reception at the MDBS will be garbled, and accordingly the next 6 bit flag will again indicate that the return channel is open, whereupon again statistically it is unlikely that more than one M-ES will attempt to communicate following the idle flag.

When a M-ES is ready to transmit and the same detects a 6 bit flag indicating an idle return channel, the same will immediately begin transmitting the 38 bit dotting sequence, the 22 bit synchronizing sequence and then at least one data block, typically 385 bits comprising a lesser number of actual information bits and some appended error correction code (ECC) to allow detection and correction of multiple errors and detection of a larger number of uncorrectable errors in the data block.

The general format of the dotting sequence, sync bits and data bits is also shown in FIG. 1, with the dotting sequence of a M-ES reverse link broadcast shown to start shortly after the completion of a 6 bit flag in the forward link indicating the return channel is idle. As shown in the Figure, there is some space between the end of the busy/idle flag showing the return channel to be idle and the actual beginning of the 38 bit dotting sequence, particularly as received at the site of the MDBS. In particular, not only is there a delay caused by the idle flag detection time and time required to turn on the M-ES's transmitter and start transmitting, but there is an additional and variable increment in transmission transit time to the M-ES and back to the MDBS which depends upon the separation of the two devices. Given the availability of the channel as indicated by the idle flag, the MDBS will begin monitoring the return channel signal after completion of the idle flag for the purpose of detecting a dotting sequence of a (single) transmitting M-ES, if a M-ES is transmitting, so that the next busy/idle flag may indicate that the reverse link channel is now temporarily busy. In that regard, note that while the dotting sequence is shorter than one data block of the forward link signal, the data block of the reverse link signal spans many data blocks of the forward link signal, so that once a M-ES captures the reverse link channel, the reverse link channel will be busy for a plurality of data blocks of the forward link channel until released at the end of the packetized data transmission of the broadcasting M-ES.

Figure 2:
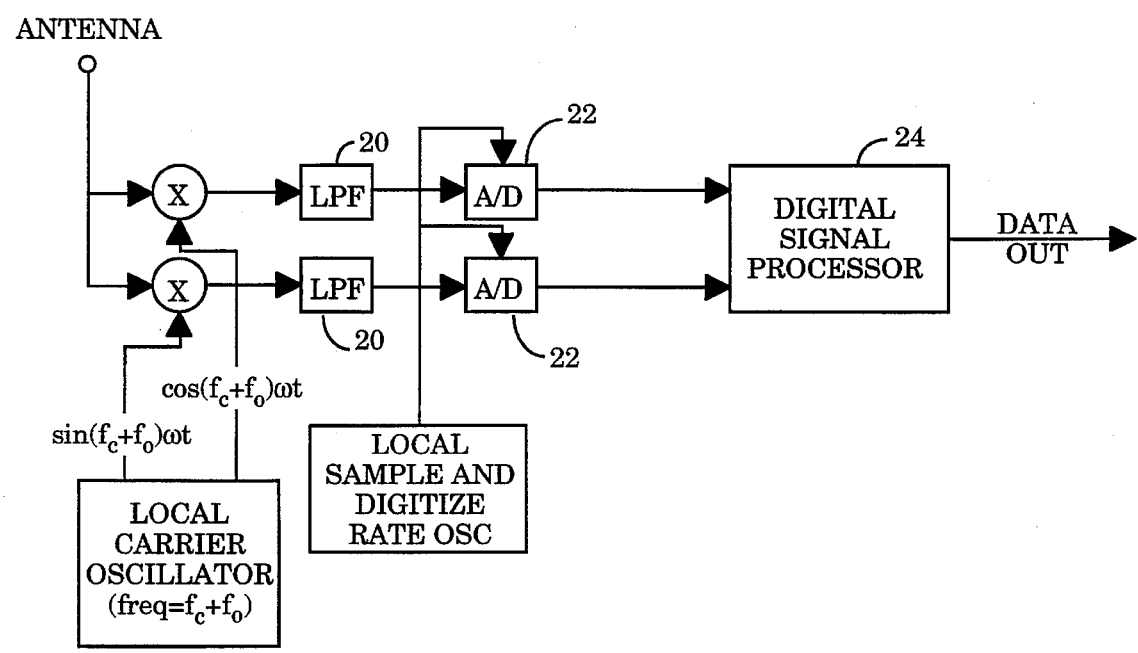
FIG. 2 is a block diagram of the circuit of the preferred embodiment of the present invention.

The present invention allows, among other things, the MDBS to detect reception of the dotting sequence from a transmitting M-ES in sufficient time to set the busy/idle flag to busy on the next transmission thereof, and to recover the data being sent by the M-ES. This is accomplished by the circuit of FIG. 2 as described below.

The signal transmitted by a M-ES back to the MDBS may be represented by the signal:

$$\cos(2\pi f_c t + \phi(t))$$

where:
 $f_c$=the channel carrier frequency used by the M-ES's transmitter
 $\phi$=the information containing carrier phase modulation
 t=time On reception by the MDBS, the signal is down converted by multiplying the received signal by the two reference signals:

Cos(2π(f_c+f_o))

and

Sin(2π(f_c+f_o))

where:

$f_o$=the error in frequency between the local oscillator at the MDBS receiver and the transmitted signal carrier frequency of the M-ES (an arbitrary and constant phase shift should also be included, but it has no effect on the discussion to follow and is left out for simplicity)

This yields:

$$Cos(2\pi f_c t + \phi(t)) \, Cos(2\pi(f_c + f_o)) = \frac{1}{2} Cos(-2\pi f_0 t + \phi(t)) + \frac{1}{2} Cos(2\pi(2f_c + f_0)t + \phi(t)),$$

and $$Cos(2\pi f_c t + \phi(t)) \, Sin(2\pi(f_c + f_o)) = \frac{1}{2} Sin(2\pi f_0 t - \phi(t)) + \frac{1}{2} Sin(2\pi(2f_c + f_0)t + \phi(t))$$

The high frequency components (at approximately twice the carrier frequency $2f_c$) are filtered out by the low pass filters 20. Ignoring scaling, this leaves the downshifted components:

$$Cos(-2\pi f_o t + \phi(t))$$

,
and $$Sin(2\pi f_o t - \phi(t))$$

At the end of the transmission of the six idle flag bits on the forward link indicating that the respective reverse link is not busy, the MDBS begins looking for a dotting sequence in the signal received on the respective reverse link channel. This is done by repetitively sampling the foregoing downshifted signal components, in the preferred embodiment at a rate of approximately four times the expected bit rate of the received signal and digitized by analog to digital converters 22 to provide corresponding digitized signal components, generally referred to hereinafter as the inphase (I) and quadrature (Q) components of the received signal vector, to digital signal processor 24 and associated memory (not individually shown) for storage and subsequent analysis.

During the dotting sequence, the received "data" is the string of alternate 1s and 0s, so that the phase at successive symbol times alternates between 90° and −90° (neglecting for the moment the inherent intersymbol interference of GMSK modulation). Since the information is in the phase angle φ, one needs to determine φ at each symbol time, or to find Cosφ and Sinφ, then find ArcTan φ.

In accordance with the method of the present invention, for each successive signal vector spaced approximately one symbol period after the previous signal vector (e.g. every fourth set of signal vector samples), a difference vector having a phase equal to the difference in phase of the two signal vectors is found. This could be done by dividing the signal vectors, but the same result is obtained by multiplying one signal vector $I_o, Q_o$ by the conjugate $I_1, -Q_1$ of the other signal vector $I_1, Q_1$ one bit time away as follows:

$$(I_o Q_o)^*(I_1, -Q_1) = (I_o I_1 + Q_o Q_1, I_1 Q_o - I_o Q_1)$$

This process provides four sets of difference vectors, as the calculation is carried out for each signal sample set, yielding one set of difference vectors for signal vector samples 1,5,9,13 etc., one set of difference vectors for signal vector samples 2,6,10,14 etc., one set of difference vectors for signal vector samples 3,7,11,15 etc. and one set of difference vectors for signal vector samples 4,8,12,16 etc.

To detect the dotting sequence, it is to be noted that for GMSK modulation of an alternating 1,0 bitstream, the phase angle between adjacent signal vectors alternates between +58° and −58°. In the presence of a frequency error between the transmitter carrier frequency and the receiver carrier used to downshift the received signal, one of these angles will be increased and one will be decreased. Accordingly during the dotting sequence, successive difference vectors taken one bit time part will themselves have these alternating phase angles as shifted somewhat by the error frequency. However for no more than a reasonable frequency error, successive difference vectors taken one bit time apart and with approximately correct bit timing will have positive inphase components and alternating quadrature components. To detect the dotting sequence in accordance with the present invention, the quadrature component of every other difference vector taken one bit time apart is inverted and then the difference vectors taken one bit time apart are vector summed.

For signal vectors sampled midway between bit times during the dotting sequence, such vectors will have a substantially zero quadrature component (will be substantially aligned) so that the resulting difference vectors will all fall approximately along the positive inphase axis (except for the effect of the frequency error) so that when every other quadrature component is inverted and a number of difference vectors are summed, the sum will accumulate substantially, indicating that GMSK information is being received. For signal vectors sampled approximately on the correct bit times during the dotting sequence, such vectors will each also have a substantial quadrature component, so that when every other quadrature component is inverted and a number of difference vectors are summed, the sum will accumulate even more, indicating that the GMSK information being received is the dotting sequence. The dotting sequence is indicated by the sum of the difference vectors, taken on a sliding window, one bit time apart and after alternate quadrature components are inverted, exceeding a predetermined threshold.

Thus of the four sets of difference vectors used, only one or perhaps two will accumulate adequately when combined in this manner to indicate the presence of the dotting sequence. Note also the difference between the local bit oscillator and the oscillator at the broadcasting M-ES will not cause enough bit timing drift to require local bit rate correction for dotting sequence detection, or for that matter for sync and data detection.

Figure 3:
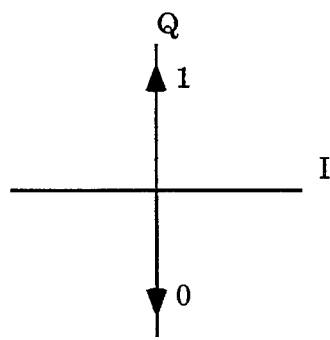
FIG. 3 is a diagram illustrating the difference vectors for a 1 bit and a 0 bit, assuming no intersymbol interference and no carrier frequency error $f_o$.

For determining the frequency error, assume for the moment that bit timing is known. If there is no frequency error or intersymbol interference, a 1 in the bit period will provide a resulting difference vector $(I_o I_1 + Q_o Q_1, I_1 Q_o - I_o Q_1)$ at an angle of 90° representing a vector pointing straight up, and after another bit period representing a change to 0, will provide a resulting difference vector $(I_o I_1 + Q_o Q_1, I_1 Q_o - I_o Q_1)$ at an angle of −90° representing a vector pointing straight down, as shown in FIG. 3. If one inverts one of the two difference vectors by changing the sign of both the inphase and the quadrature part thereof, the two difference vectors will be collinear.

If, however, there is a frequency error $f_o$, the second signal vector, taken one bit period T after the previous signal vector, will have an additional phase component θ due to the frequency error times the time between samples, namely:

$$\theta = 2\pi f_o T$$

Figure 4:
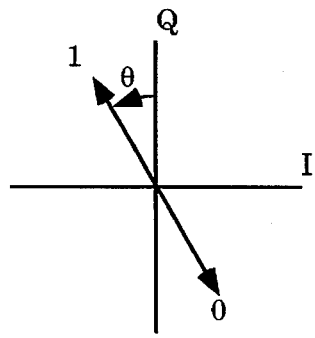
FIG. 4 is a diagram similar to FIG. 3 illustrating the effect of a carrier frequency error $f_o$ on the difference vectors for a 1 bit and a 0 bit, again assuming no intersymbol interference.

Consequently for a 1, instead of the difference vector pointing straight up, it will be rotated off the vertical by the angle θ (see FIG. 4). For the following 0, the difference vector will not point straight down, but will also be rotated off the vertical by the angle θ. When the second of the two vectors is inverted, the two vectors will be collinear, but rotated from the vertical by the angle θ, plus of course other phase angle increments due to other errors, primarily due to noise in the received signals when sampled.

This process is continued throughout the dotting sequence, with every other difference vector being inverted (both inphase and quadrature components, in comparison to only the inversion of the quadrature component for detection of the dotting sequence). When all such difference vectors are then added, the resulting vector will itself have a phase angle of θ off the vertical or quadrature axis, plus an error due to the noise, but will be increased in length over an individual difference vector by a factor of n, the number of difference vectors added. However the noise will generally be random in both amplitude and phase, so that while the lengths of the difference vectors containing the θ measurements are additive, the noise components N of each difference vector will not add linearly with n to provide a noise component nN in the vector sum determining θ, but rather will tend to add to the vector sum determining θ in the amount of $N\sqrt{n}$. Thus the addition of multiple difference vectors has increased the accuracy (decreased the error) of the frequency estimate by $\sqrt{n}$, the number of difference vectors added to obtain the result.

Figure 5:
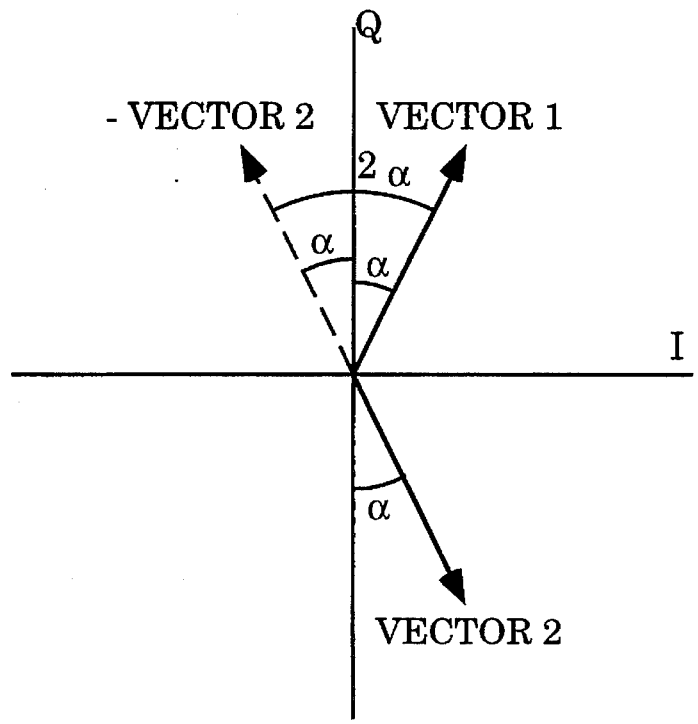
FIG. 5 is a diagram similar to FIG. 3 illustrating the difference vectors for a 1 bit and a 0 bit during the dotting sequence and with intersymbol interference, again assuming no carrier frequency error $f_o$.

Now considering only the effect of intersymbol interference, when one of two consecutive difference vectors is inverted, the two consecutive difference vectors will not be collinear, but substantially inclined to each other, say by the angle 2α, where α is the phase deviation from the full + or −90° shift for a string of alternate 1s and 0s caused by the intersymbol interference (see FIG. 5). However, to consider the process in detail, assume for purposes of example that in accordance with the process, even numbered difference vectors are inverted and odd numbered difference vectors are not. With no frequency error as shown in FIG. 5, adding difference vector 1 to the inverted (−) vector 2 will yield a vector sum falling on the vertical (quadrature) axis. Thus the intersymbol interference has somewhat reduced the length of the sum, but not its phase angle. Thus the effect of intersymbol interference drops out entirely if an odd number of signal vectors are used to provide an even number of difference vectors to be added to determine θ.

Figure 6:
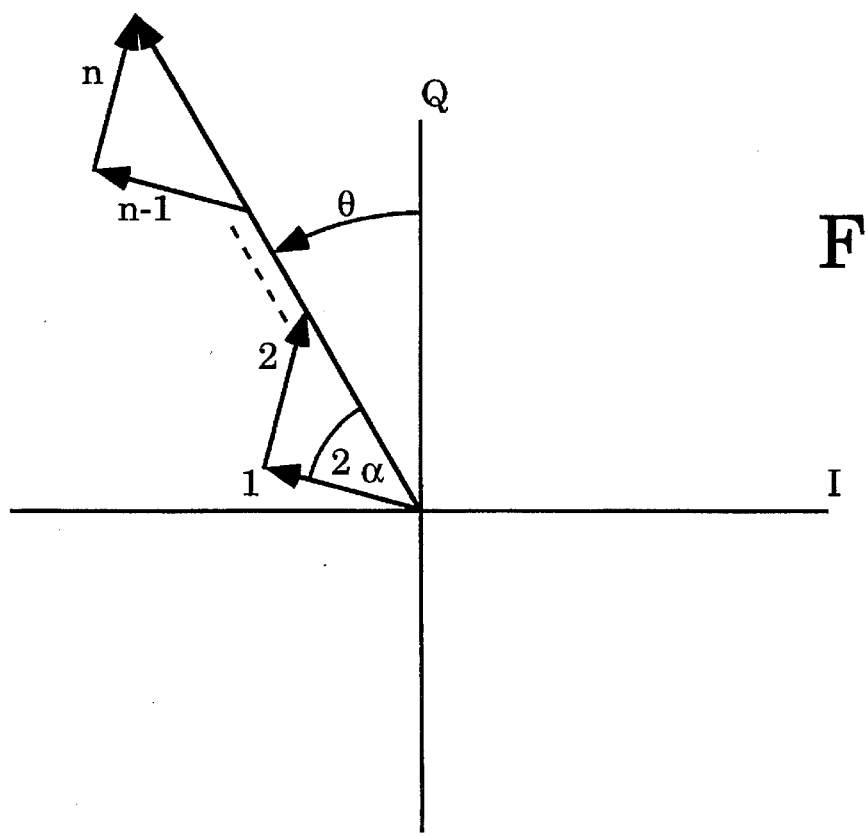
FIG. 6 is a diagram illustrating how the difference vectors of FIG. 5 sum, after inversion of every other difference vector, to provide information regarding the frequency error substantially unaffected by the intersymbol interference.

Now including the effect of a frequency error, the vector sum will be rotated thereby as shown in FIG. 6. In effect, the presence of intersymbol interference makes the difference vectors being summed non-collinear, not effecting the angle θ of the vector sum (for an even number of difference vectors) but reducing the length of the sum, allowing the noise to have a somewhat larger relative contribution than if there were no intersymbol interference.

With respect to the recovery of bit timing in the preferred embodiment of the present invention, it is noted that for GMSK modulation, a positive phase change of 90° (nominal) for a given bit time in comparison to the immediately previous bit time indicates a 1, and a negative phase change of 90° (nominal) for a given bit time in comparison to the immediately previous bit time represents a 0. In the case of the dotting sequence, the intersymbol interference reduces these phase shifts to approximately ±58°, with the shifts for random data varying between 58° and 90° dependent upon the specific bit sequence of the data. In any event however, it is to be noted that for a 1, the associated difference vector will have a positive quadrature component, and for a 0 the associated difference vector will have a negative quadrature component. Consequently, for a 2 sequence 1,0, the first difference vector at the bit time of the 1 will have a positive quadrature component, and the difference vector for the bit time of the following 0 will have a negative quadrature component. Neglecting intersymbol interference, the theoretical difference vectors therebetween have a quadrature component passing through 0 halfway between the bit time of the 1 and the 0. In accordance with the preferred embodiment, samples are taken at approximately 4 times the bit rate. Thus if a sample is taken right on the desired bit timing, two samples later the sample will be halfway between the bit timing of the 1 and 0 bits, and for the 1,0 bit sequence, will be at the zero crossing of the quadrature component of the difference vector. If the sample timing, however, is somewhat early, the sample midway between bit times will be taken before the quadrature component of the difference vector reaches 0, whereas if the sample timing is late, the quadrature component of the difference vector for the sample midway between bit times will be negative.

The foregoing may be carried out in a similar manner for a bit sequence of 0,1. Here however, the direction of the 0 crossing of the quadrature component of the difference vector for the sample midway between the bit times of the 0 and the subsequent 1 is in the opposite direction, so that both early sampling and late sampling will provide a quadrature vector component of opposite sign from the corresponding early and late sampling for a 1,0 sequence. Thus, to determine whether the quadrature component of the difference vector taken halfway between samples one bit time apart indicate that those samples were taken early or late, one must consider both the sign of the quadrature component of the difference vector taken halfway between samples and the sign of the quadrature component of at least one, typically the later difference vector taken on the associated bit times.

For a bit sequence of 1,1, there will not be a substantial phase change in the difference vector between the first 1 and the second 1, so that such a sequence will not provide any information with respect to sample timing. Similarly, a bit sequence of 0,0 will also provide no information with respect to sample timing using this technique, so that upon the occurrence of such bit sequences as indicated by the quadrature component of the two difference vectors associated with the two bits being of the same sign, no contribution to bit timing is made.

In the preferred embodiment MDBS, the quadrature components of the applicable ones of each set of difference vectors are summed, inverting the same when required depending on the direction of the bit transition, and the difference vectors having the best timing taken as the set of difference vectors taken T/2 times away from the smallest sum.

Figure 7:
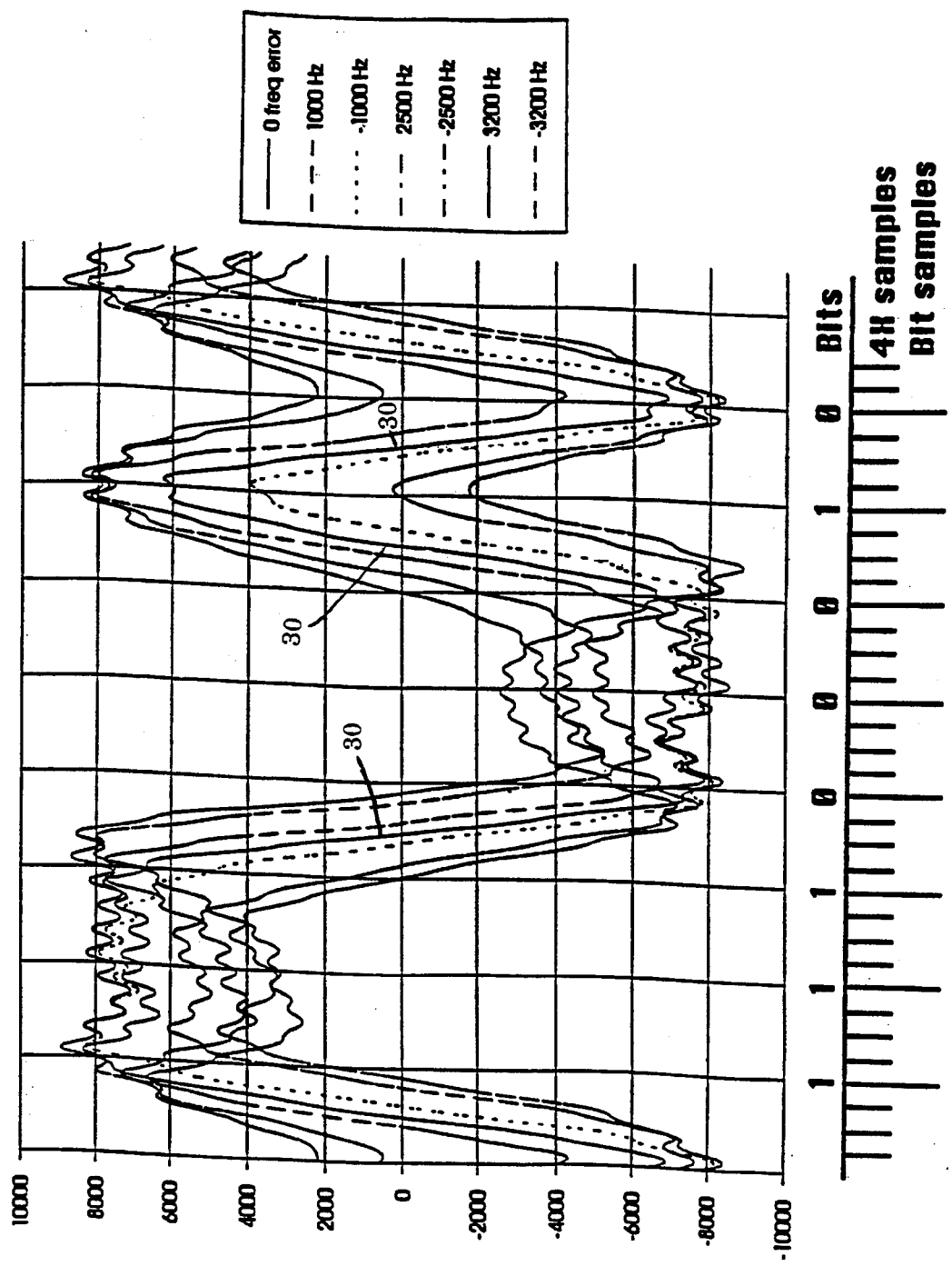
FIG. 7 presents a family of curves showing the time response of the quadrature component of the difference vector for the bit sequence 11100010 for zero and various non-zero frequency error conditions.

The foregoing is illustrated in graphical form in FIG. 7. That Figure represents the time response of the quadrature component of the difference vector for the bit sequence 11100010 as shown at the bottom of the graph. The various time response curves represent the time response under various frequency error conditions. The zero frequency error line 30 represents the response for the condition whereby the received signal is in effect demodulated to provide the baseband GMSK signal, whereas the other curves represent the time response of the quadrature component of the difference vectors for samples of the signal vector after downshifting from the carrier to ±1000 Hz, ±2500 Hz and ±3200 Hz. It will be noted that curve 30 for the zero frequency error condition remains well above zero for the bit times of the 1 bits and well below zero for bit times of the 0 bits. It will be noted further that this curve crosses zero halfway between the bit times for the transition sequences 1, 0 and 0, 1, in the prior case crossing zero in a negative going direction and in the latter case crossing zero in the positive going direction. These zero crossings accurately align with the samples taken midway between the true bit sample times. Earlier sampling on the other hand that would result by sliding the bit samples slightly to the left in FIG. 5, would result in the midpoint sample having a positive quadrature component on a downward projecting portion of the curve and negative quadrature component on the upward projecting portion of the curve, either condition indicating that a later sampling time should be considered to determine if it may be the better sampling time to use.

The curves of FIG. 7 also illustrate that the shape of the time response of the quadrature component of the difference vectors becomes more and more unsymmetrical as the frequency error increases, which ultimately may either itself or with other factors, cause misdetection. Accordingly, for this reason it is preferred to provide the course frequency correction to the different vectors as hereinbefore described and then determine which difference vectors provide the best bit timing in accordance with the foregoing.

Having now described the coarse frequency correction, bit timing recovery and dotting sequence detection, the integration of these functions into a working MDBS will now be described. When the respective reverse link channel is idle, the MDBS will transmit the six bit idle flag on the respective forward link channel and then start monitoring the respective reverse link channel through the circuit of FIG. 2 by downshifting the received, modulated carrier signal close to baseband, by multiplying the downshifted signal by the inphase and quadrature components of a local carrier oscillator and filtering out the high frequency components of the product to obtain the inphase and quadrature components of the downshifted signal vector. The inphase and quadrature components of the signal vector are sampled at four times the expected bit rate, the samples digitized and then stored in memory. After the fifth signal vector sample set is taken, which will be one bit time (local estimate) after the first signal vector sample set is taken, the difference vectors can start to be determined as new samples are taken and stored.

Next the dotting sequence detection and coarse frequency correction calculations begin. Since even if a M-ES is going to respond, the sampling at the MDBS will begin before the dotting sequence reception begins, and the coarse frequency correction is dependent on the signal characteristics of the dotting sequence, the dotting sequence will not immediately be detected. However, using a sliding window equal to or somewhat smaller than the full dotting sequence for the dotting sequence detection, eventually the dotting sequence will be detected if present.

If the dotting sequence is not detected within the allotted time, sampling may cease, data may be overwritten as desired and the next busy/idle flag to be broadcast forward link is again set to the idle status. If the dotting sequence is detected, samples continue to be taken and stored. The largest vector sum indicating the presence of the dotting sequence is used to determine the angle $\theta=2\pi f_o T$ off the vertical (see FIG. 4) as described and the stored difference vectors for sync and data corrected to remove the angle $\theta$ therefrom. This may be done by changing the vector sum to polar form (magnitude M and angle $\Psi$) as follows:

$$M = \sqrt{I_s^2 + Q_s^2}$$

$$\theta = \text{ArcTan}\left(\frac{-I_s}{Q_s}\right)$$

where:
$I_s$ and $Q_s$ are the inphase and the quadrature components of the vector sum of the difference vectors taken during the dotting sequence to detect the same.

The difference vectors are also changed to polar form in a similar manner, and then the difference vectors converted back to rectangular coordinates with the angle $\theta$ removed therefrom by the equation:

$$I, Q = M \cos(\Psi - \theta), M \sin(\Psi - \theta)$$

where:
$\Psi$ is the uncorrected phase angle of the difference vectors.

Once the coarse frequency error correction in the difference vectors for sync and data has been made, bit timing is determined across the sync and data difference vectors as described. In this regard, the bit clocks in the M-ESs and the MDBS are sufficiently close to each other in frequency that the one of the four sets of difference vectors having the best average bit timing may be used for the entire sync and data sequence. This is determined as the set having as the set T/2 times away, the set with the minimum total (properly signed) quadrature component sum.

Finally, a fine frequency error correction is made to the sync and difference vectors. Here however, the bit pattern is no longer alternate 1s and 0s, so every other difference vector cannot be automatically inverted as in the coarse frequency correction. Instead, the sign of the quadrature component of each difference vector is examined, and if negative, the difference vector is inverted. If the quadrature component is positive, it is not inverted. In essence, this follows the scheme used during the dotting sequence to determine the coarse frequency correction, but altered to track the yet unknown information being received. This fine frequency error correction is done cumulatively across the block of data. Then the bit values are determined by the sign of the quadrature component of the respective resulting difference vectors.

Finally, the present invention has the ability to monitor a reverse link channel and determine whether the same is being used for voice or data. In particular, referring to FIG. 5 again, it will be noted that for random data with intersymbol interference, the difference vectors will have a positive inphase component, even though the quadrature component will be random. On average, this will be true even for a reasonable uncorrected frequency error. For voice however, the phase of the signal will be relatively random, with positive and negative inphase and quadrature components equally likely. Consequently, to determine whether signals are voice or data, the signal vector may be sampled and the difference vectors stored as before, and the quadrature components of alternate difference vectors inverted and then the vectors summed to determine whether data is present by the steadily and substantially increasing sum less than characteristic of the dotting sequence, or voice is present as indicated by the noisy and not significantly increasing sum.

While the present invention has been disclosed and described with respect to a certain preferred embodiment thereof, it will be understood to those skilled in the art that the present invention may be varied without departing from the spirit and scope thereof.

I claim:

1. A method of detecting a dotting sequence preceding packetized data, the dotting sequence being of alternate 1s and 0s, the foregoing dotting sequence and data being phase modulated on a transmitter carrier as a transmitted signal, comprising the steps of:

(a) receiving the transmitted signal and downshifting the received signal by multiplying the received signal by the inphase and quadrature components of a receiver carrier to obtain the inphase and quadrature components of a signal vector;

(b) sampling the inphase and quadrature components of the signal vector at a rate that is a multiple of a locally generated estimate of the transmitted bit rate and digitizing the samples to obtain a plurality of digitized inphase and quadrature samples of the signal vector;

(c) for each successive digitized inphase and quadrature samples of the signal vector and the digitized inphase and quadrature samples of the signal vector taken one bit time earlier using the locally generated estimate of the transmitted bit rate, determining a difference vector having a phase responsive to the difference in phase between the inphase and quadrature samples of the signal vector and the digitized inphase and quadrature samples of the signal vector taken one bit time earlier;

(d) for a set of difference vectors based on digitized inphase and quadrature samples of the signal vector taken integer bit times apart during a time the dotting sequence may be received;

(i) inverting the quadrature component of every other difference vector; and (ii) providing a vector sum by summing the difference vectors in the set after step (d) (i) has been performed;

(e) determining whether the dotting sequence has been received by a magnitude of the vector sum determined in step (d) (ii).

2. The method of claim 1 wherein an estimate of the frequency error between the receiver carrier and the transmitter carrier is obtained when the dotting sequence has been received, further comprising the steps of:

(f) for the set of difference vectors having a largest sum in step (e), inverting the inphase and the quadrature components of every other difference vector of step (c);

(g) providing a vector sum by summing the difference vectors in the set after performing step (f); and, (h) determining the phase angle between the vector sum of step (g) and an expected phase angle characteristic of zero frequency error, and estimating the frequency error as the frequency having a phase change in one bit time equal to the phase angle between the vector sum of step (g) and the expected phase angle characteristic of zero frequency error.

3. The method of claim 2 further comprising the step of correcting the difference vectors of step (c) taken during data reception for the frequency error determined in claim 2.

4. The method of claim 3 further comprising the steps of:

finding the set of difference vectors taken one bit time apart during data reception which are closest to a zero-crossing of the quadrature component of the respective difference vectors during 0 to 1 and 1 to 0 data transitions; and, using as the phase change from one bit time to the next bit time, the phase of the set of difference vectors taken one half of a bit time from the set of difference vectors found in the finding step.

5. The method of claim 4 wherein the frequency error is further estimated during the reception of the data signal by:

inverting the difference vectors of step (c) having a quadrature component of a predetermined sign;

summing the inverted difference vectors to determine the phase shift from one bit time to the next;

correcting the difference vectors of step (c) taken during data reception; and, determining the data by the phase of the resulting difference vectors.

* * * * *

UNITED STATES PATENT AND TRADEMARK OFFICE
CERTIFICATE OF CORRECTION

PATENT NO. : 5,511,098
DATED : April 23, 1996
INVENTOR(S) : Steven H. Gardner

It is certified that error appear in the above-identified patent and that said Letters Patent is hereby corrected as shown below:

In section [54] Title and column 1 at line 1, please delete " APPARATUS " and insert -- APPARATUS FOR --.

In column 5 at line 5, please delete " $Sin(2\pi(f_c+f_o))$ " and insert -- $Sin(2\pi(f_c+f_o))$ --.

In column 6 at line 7, please delete " bitstream " and insert -- bit stream --.

In column 8 at line 4, please delete " 2 " and insert -- 2 bit --.

In column 8 at line 54, please delete " T/2 times " and insert -- T/2 bit times --.

In column 10 at line 28, please delete " T/2 times " and insert -- T/2 bit times --.

Signed and Sealed this

Seventeenth Day of June, 1997

*Attest:*

BRUCE LEHMAN

*Attesting Officer*     *Commissioner of Patents and Trademarks*